US006663914B2

(12) United States Patent
Black

(10) Patent No.: US 6,663,914 B2
(45) Date of Patent: Dec. 16, 2003

(54) METHOD FOR ADHERING A RESISTIVE COATING TO A SUBSTRATE

(75) Inventor: Steven A. Black, Murray, UT (US)

(73) Assignee: Trebor International, West Jordan, UT (US)

( * ) Notice: Subject to any disclaimer, the term of this patent is extended or adjusted under 35 U.S.C. 154(b) by 390 days.

(21) Appl. No.: 09/738,723

(22) Filed: Dec. 15, 2000

(65) Prior Publication Data

US 2002/0182861 A1 Dec. 5, 2002

Related U.S. Application Data

(60) Provisional application No. 60/179,541, filed on Feb. 1, 2000.

(51) Int. Cl.[7] ............................ B05D 5/12; B05D 3/12; B05D 1/02; B05D 3/02; C23C 14/00

(52) U.S. Cl. ................................ 427/8; 427/9; 427/10; 427/101; 427/307; 427/309; 427/383.1; 427/383.3; 427/383.5; 427/421; 427/455; 427/250; 205/192.1

(58) Field of Search .......................... 427/8, 9, 10, 101, 427/307, 309, 383.1, 383.3, 383.5, 421, 455, 250; 205/192.1

(56) References Cited

U.S. PATENT DOCUMENTS

| | | | | |
|---|---|---|---|---|
| 3,493,428 | A | 2/1970 | Hedberg et al. | 117/211 |
| 3,960,564 | A | 6/1976 | Molenaar et al. | 430/16 |
| 4,072,243 | A | 2/1978 | Conant et al. | 215/12 |
| 4,091,267 | A | 5/1978 | Harman | 219/544 |
| 4,125,640 | A | 11/1978 | Conant et al. | 427/250 |
| 4,145,601 | A | 3/1979 | Lavrentiev et al. | 219/298 |
| 4,401,879 | A | 8/1983 | Shukla et al. | 219/206 |
| 4,420,544 | A | 12/1983 | Lawson et al. | 429/13 |
| 4,479,074 | A | 10/1984 | Bhalla | 313/628 |
| 4,516,814 | A | 5/1985 | Ireland | 339/7 |
| 4,689,475 | A | 8/1987 | Kleiner et al. | 219/553 |
| 4,707,586 | A | 11/1987 | Voss et al. | 219/203 |
| 4,748,367 | A * | 5/1988 | Bloch et al. | 310/343 |
| 4,859,505 | A * | 8/1989 | Nakayama et al. | 427/305 |
| 4,889,974 | A | 12/1989 | Auding et al. | 219/543 |
| 4,946,546 | A | 8/1990 | Bourgeois-Moine | 156/543 |
| 4,948,707 | A | 8/1990 | Johnson et al. | 430/11 |
| 4,978,814 | A | 12/1990 | Honour | 174/130 R |
| 5,039,840 | A | 8/1991 | Boardman | 219/270 |
| 5,057,674 | A | 10/1991 | Smith-Johannsen | 219/553 |
| 5,183,795 | A | 2/1993 | Ting et al. | 437/230 |
| 5,315,063 | A | 5/1994 | Auclair | 174/78 |
| 5,388,177 | A | 2/1995 | Ono et al. | 392/386 |
| 5,448,037 | A | 9/1995 | Takase et al. | 219/547 |
| 5,493,102 | A | 2/1996 | Takase et al. | 219/547 |
| 5,498,853 | A | 3/1996 | Gross et al. | 219/461.1 |
| 5,573,692 | A | 11/1996 | Das et al. | 219/543 |
| 5,616,266 | A | 4/1997 | Cooper | 219/543 |
| 5,643,483 | A | 7/1997 | Kubota et al. | 219/543 |
| 5,648,125 | A | 7/1997 | Cane | 427/534 |
| 5,665,262 | A | 9/1997 | Hajaligol et al. | 219/553 |

(List continued on next page.)

FOREIGN PATENT DOCUMENTS

| | | | | |
|---|---|---|---|---|
| JP | 57119505 A * | 7/1982 | | H03H/03/02 |
| JP | 363153280 A | 6/1988 | | 428/450 |

*Primary Examiner*—Michael Barr
(74) *Attorney, Agent, or Firm*—Pate Pierce & Baird

(57) ABSTRACT

A method for adhering a resistive coating to a substrate for use in process fluids employed in the semiconductor processing industry in clean, particle-free, nonreactive, non-trapping, ultra-pure, thermally tolerant, sealed systems. In one arrangement, the method may include the steps of selecting a substrate having a wall, modifying a surface of the wall to provide a roughened texture suitable for mechanically securing a coating thereto, and applying a conductive coating that is configured to be electrically resistive, to extend over at least a portion of the roughened texture, and to adhere thereto throughout variations in operational temperatures thereof.

34 Claims, 8 Drawing Sheets

U.S. PATENT DOCUMENTS 5,667,712 A 9/1997 Sutorius et al. ............. 219/535
5,750,958 A * 5/1998 Okuda et al. ............... 219/267
5,877,474 A 3/1999 Konishi ...................... 219/270
5,911,899 A 6/1999 Yoshikai et al. ............ 219/522
5,968,379 A 10/1999 Zhao et al. ............ 219/121.52
6,037,574 A 3/2000 Lanham et al. ............. 219/544
6,130,601 A 10/2000 Brown et al. ............... 338/307
6,141,870 A 11/2000 McDermott et al. .......... 29/852
6,146,700 A 11/2000 Yuan et al. ................. 427/304
6,172,344 B1 1/2001 Gordon et al. .............. 219/529
6,222,166 B1 4/2001 Lin et al. .................... 219/538
6,376,816 B2 4/2002 Cooper et al. .............. 219/543
6,433,319 B1 8/2002 Bullock et al. ............. 219/543
6,479,094 B2 * 11/2002 Black ......................... 427/101
6,544,583 B2 4/2003 Black ............................ 427/8

* cited by examiner

METHOD FOR ADHERING A RESISTIVE COATING TO A SUBSTRATE

RELATED APPLICATIONS

This Patent Application is a continuation in part of U.S. Provisional Patent Application Ser. No. 60/179,541 filed on Feb. 1, 2000.

BACKGROUND

1. The Field of the Invention

This invention relates to semiconductor processing technology and, more particularly, to novel systems and methods for heating fluids and making heaters carrying ultra-pure fluids for processing operations.

2. The Background Art

The semiconductor manufacturing industry relies on numerous processes. Many of these processes require transportation and heating of de-ionized (DI) water, acids and other chemicals. By clean or ultra-pure is meant that gases or liquids cannot leach into, enter, or leave a conduit system to produce contaminants above permissible levels. Whereas other industries may require purities on the order of parts-per-million, the semiconductor industry may require purities on the order of parts-per-trillion.

Chemically clean environments maintained for handling pure de-ionized (DI) water, acids, chemicals, and the like, must be maintained free from contamination. Contamination in a process fluid may destroy hundreds of thousands of dollars in value by introducing contaminants into a process during a single batch. Several difficulties exist in current systems for heating, pumping, and carrying process fluids (e.g., acids, DI water, etc.). Leakage into or out of a liquid must be eliminated. Moreover, leaching and chemical reaction between any contained fluid and the carrying conduits must be eliminated.

Elevated temperatures in semiconductor processing are often over 100° C., and often sustainable over 120° C. In certain instances, temperatures as high as 180° C. may be approached. It is preferred that all heating and carrying of process fluids include virtually no possibility of contact with any metals regardless of the ostensibly non-reactive natures of such metals, regardless of a catastrophic failure of any element of a heating, transfer, or conduit system.

Conventional immersion heaters place a heating element, typically sheathed in a coating, directly into the process fluid. The heating element and process fluid are then contained within a conduit. Temperature transients in immersion heaters may overheat a sheath up to a melting (failure) point. A failure of a sheath may directly result in metallic or other contamination of the process fluid. Meanwhile, temperature transients in radiant heaters may fracture a rigid conduit.

A heating alternative is needed that does not have the risks associated with conventional radiant and immersion-heating elements. A system is needed that is both durable and responsive for heating process fluids. Failure that may result in fluid contamination is an unacceptable risk.

BRIEF SUMMARY AND OBJECTS OF THE INVENTION

In view of the foregoing, it is a primary object of the present invention to provide a heater for handling process fluids at elevated temperatures in the range of 0° C. to 180° C. It is an object of the invention to provide a heater having electrical resistance in close proximity to a process fluid for heating by conduction and convection without exposing process fluids to a prospect of contamination, even if electrical failures or melting of conductive paths should occur within a heater.

Consistent with the foregoing objects, and in accordance with the invention as embodied and broadly described herein, a method and apparatus are disclosed in one embodiment of the present invention as including a heater comprising one or more tubes of quartz. Tubes may be abutted end-to-end with an adaptor (e.g., fluorocarbon fitting) fitted to transition between two tubes in a series. One pass or passage, comprising one or more tubes of quartz in a series, may be fitted on each end to a manifold (e.g., header/footer) comprised of a fluorocarbon material properly sealed for passing liquid into and out of the individual passage.

Individual tubes or conduits may improve the temperature distribution therein by altering the internal boundary layer of heated fluids passing therethrough. In one embodiment, a baffle tube, within the outer tube, may have a plug serving to center the baffle in the heating tube. The plug may restrict flow, such that the fluid inside the baffle does not change dramatically. Thus an annular flow between the baffle tube and the outer heating tube may maintain a high Reynolds number in the flow, enhancing the Nusselt number, heat transfer coefficient and so forth. Moreover, the temperature distribution may be rendered nearer to a constant value across the annulus, rather than running with a cold, laminar core.

In one embodiment, a heater may be manufactured by electroless nickel plating on a roughened (textured) surface. A resistive, conductive layer may extend along most of the length of a rigid (e.g., quartz) tube. The resistive coating may be configured to connect in series or to multi-phase power along the length of a single tube. Accordingly, a quartz tube may be roughened, etched, dipped, coated, and protectively coated. The quartz tube need not be heated to sinter the conductive layer, which may be plated as a continuous ribbon of well-adhered, resistive, conducting, metallic material.

The electrical length of the heated portion may be adjusted by application of an end coating for distributing current around a conduit tube. Conductive material and mechanical fasteners may be added to provide electrical connections between the end coating and power delivery lines. For example, braided cables or straps may be clamped around a soft, conductive interface material surrounding each end of a plated section of a conduit. Mechanical clamps may maintain normal forces against the surface, while accommodating expansion with temperature, without harming mechanical bonds between the conductive/resistive coating and the conduit (substrate).

BRIEF DESCRIPTION OF THE DRAWINGS

The foregoing and other objects and features of the present invention will become more fully apparent from the following description and appended claims, taken in conjunction with the accompanying drawings. Understanding that these drawings depict only typical embodiments of the invention and are, therefore, not to be considered limiting of its scope, the invention will be described with additional specificity and detail through use of the accompanying drawings in which:

DETAILED DESCRIPTION OF THE PREFERRED EMBODIMENTS

It will be readily understood that the components of the present invention, as generally described and illustrated in the Figures herein, could be arranged and designed in a wide variety of different configurations. Thus, the following more detailed description of the embodiments of the system and method of the present invention, as represented in the Figures, is not intended to limit the scope of the invention, as claimed, but is merely representative of the presently preferred embodiments of the invention.

The presently preferred embodiments of the invention will be best understood by reference to the drawings, wherein like parts are designated by like numerals throughout. Those of ordinary skill in the art will, of course, appreciate that various modifications to the detailed schematic diagram may easily be made without departing from the essential characteristics of the invention, as described in connection with the Figures. Thus, the following description of the Figures is intended only by way of example, and simply illustrates certain presently preferred embodiments consistent with the invention as claimed herein.

Figure 1:
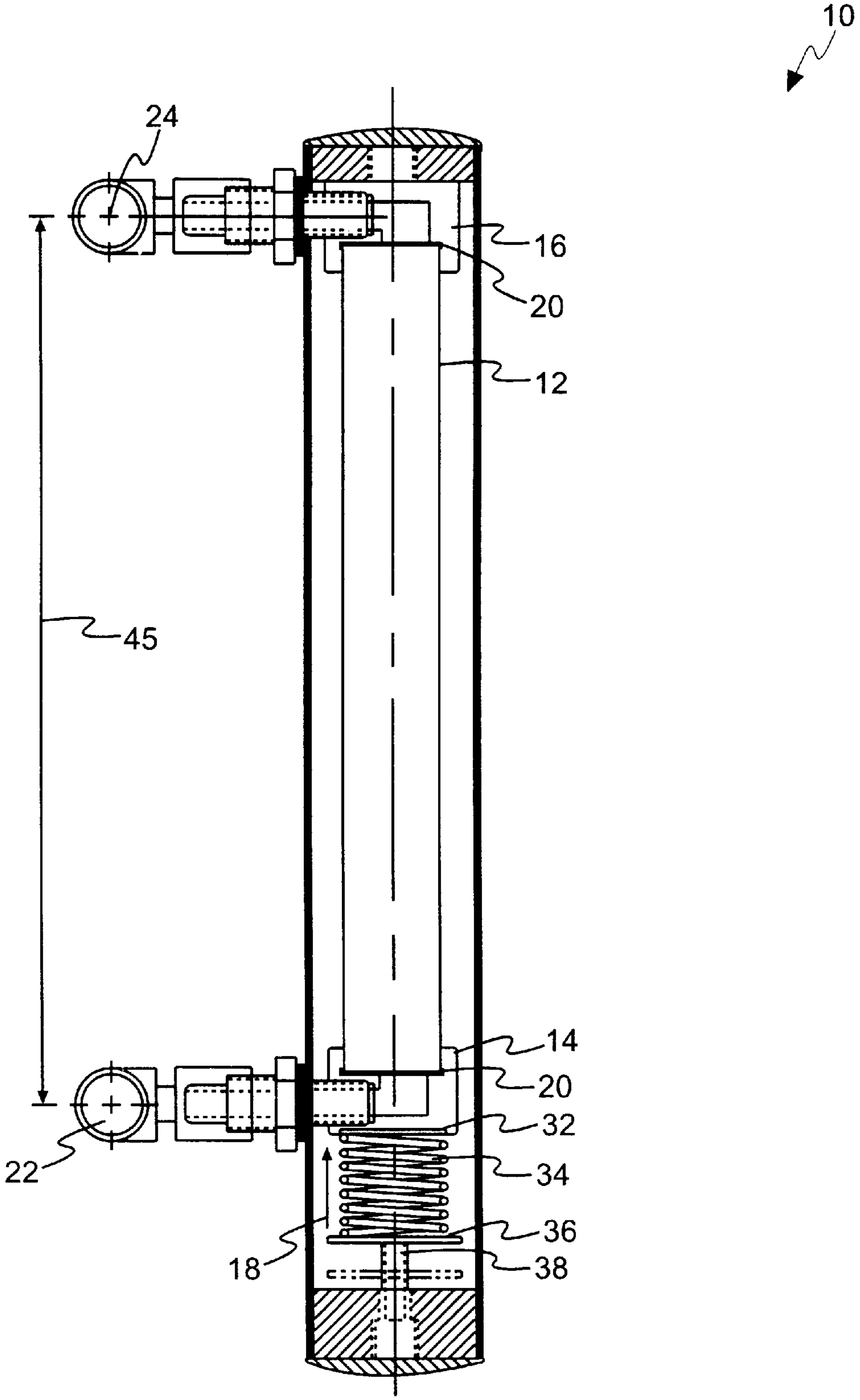
FIG. 1 is a side elevation view of a heater unit in accordance with the invention.
Figure 2:
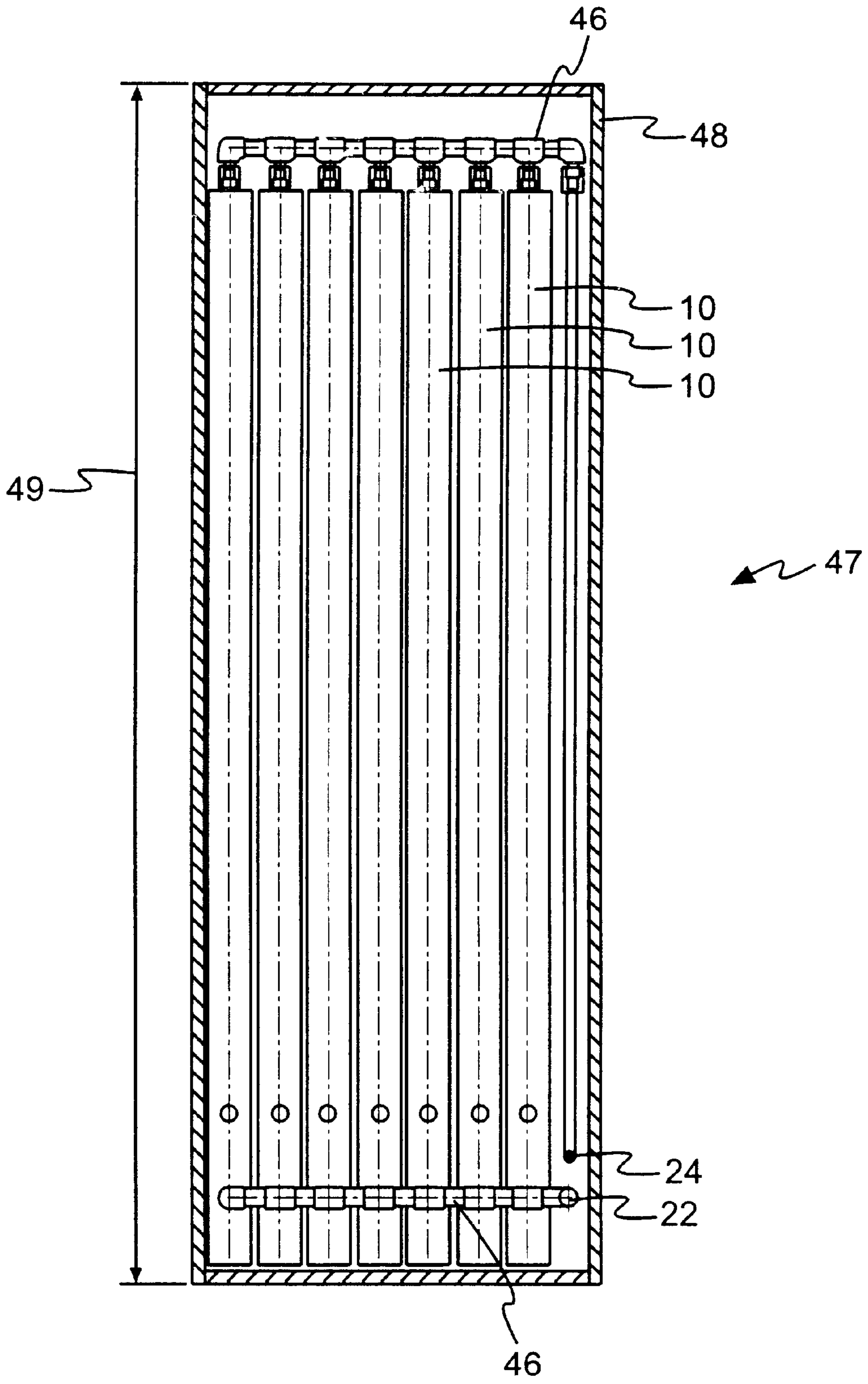
FIG. 2 is a front elevation view of a heater assembly including multiple units of the apparatus illustrated in FIG. 1.
Figure 3:
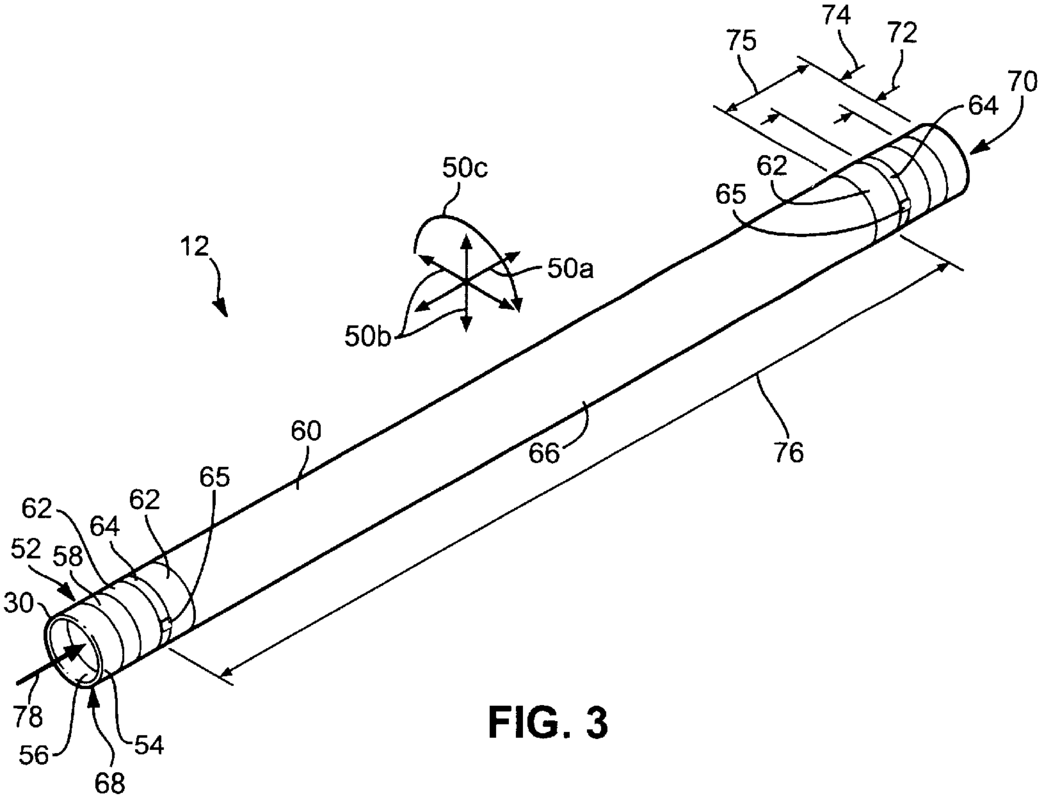
FIG. 3 is a perspective view of one embodiment of a coated conduit in accordance with the invention.

Referring to FIGS. 1–3, an apparatus 10 may be created for heating or otherwise handling process fluids such as those used in the semiconductor industry. The semiconductor-processing industry requires ultra-pure, de-ionized (DI) water, acids, and the like. A conduit 12 may be formed of a comparatively rigid material such as quartz.

Fused quartz has been found to resist distortion with temperature and time, providing dimensional stability and repeatable structural properties. Meanwhile, quartz has been found to be sufficiently non-reactive with processing fluids to maintain better than parts-per-billion (or even trillion) purity requirements in acids and water, such as de-ionized water.

Fittings 14, 16 may support the conduit 12 and apply force 18 from a pressure plate 32, loader (e.g., spring) 34, baseplate 36 and adjuster 38 to support a suitable seal 20. An inlet 22 and outlet 24 may convey fluid along the length 45 of the apparatus 10 from a manifold 46. A plurality of the individual apparatus 10 may be assembled as a heater 47 in a cabinet 48 or outer frame 48 enclosing an outer envelope 49.

The heater 47 does not expose metals to the process fluid inside the conduits 12. In one presently preferred embodiment, a resistive coating on the conduit 12 heats the conduit 12. The heat passes through the wall of the conduit 12 into the process fluid therein.

Referring to FIG. 3, a conduit 12 may be formed of a crystalline material such as fused quartz. In general, a conduit 12 may be of any suitable shape. For example, a flat plate may be fitted, as a window, or the like, against a structure suitable for sealing the window. A coating may be applied to such a substrate. Accordingly, the term conduit 12, may include any substrate, of any shape, suitable for receiving a coating for generating electrical resistance heating.

The conduit 12 may define an axial direction 50*a* and radial directions 50*b*. A wall 52 of the conduit 12 may extend in an axial direction 50*a* and circumferentially 50*c*. The wall 52 may define, or be defined by, an outer surface 54 and an inner surface 56.

In selected embodiments, an outer surface 54 may be treated, such as by mechanical etching to provide a portion of roughened surface 58. The textured surface 58 may be prepared by a mechanical abrasive action, such as grit blasting, bead blasting, or sandblasting. Accordingly, in a crystalline material, such as quartz, small crystalline chunks may remove from the surface 54, leaving small, angular, crystalline inclusions in the surface 54.

What is true for the outer surface 54, may be true for the inner surface 56 in alternative embodiments. For example, due to the processes by which a surface 54 may be coated with a resistive, conducting coating 60, the wall 52 may be treated to provide a textured surface 58, at the outer surface 54, or the inner surface 56. Since fluids (typically liquids) are transferred between devices, through heaters 10, and so forth, one practical embodiment contains a fluid flow 78 within a conduit 12, exposed to a non-reactive, ultra-pure, inner surface 56.

The coating 60 may typically be a substantially continuous film 60 extending axially 50*a* and circumferentially 50*c* about the surface 54. An end coating 62, applied over the basic coating 60, may be formed of the same material, or a different one. Since a major consideration in construction of the heater 10 is the mechanical integrity of the attachment of the coating 60 to the textured surface 58, the end coating 62 may be of any suitable material. In certain embodiments, the end coating 62 may be applied by a method very different from that of the coating 60. In alternative embodiments, the end coating 62 may simply be additional material, identical to the coating 60. The end coating 62 may decrease the resistance of the coating 60 by providing increased cross-sectional area along a portion of the length. Thus, the end coating 62 effectively shortens the resistive coating 60.

The end coating 62 provides less resistance along a circumferential direction 50*c* than does the resistive coating 60 in an axial direction 50*a* or a circumferential direction 50*c*. That is, the end coating 62 may include more material per unit of area in order to distribute electricity from a connector lug 64 in an axial 50*a* and a circumferential direction 50*c*. Thus, the end coating 62 becomes a distributor or a manifold for electricity provided to a lug 64 or connector 64 suitable for receiving a wire delivering current to the resistive coating 60.

A protective coating 66 of some suitable, conformal material may reduce scratching, wear, and chemical reaction of the resistive coating 60. The surfaces 54, 56 are not necessary uniform from end 68 to end 70 of the conduit 12. A distance 72 or smooth surface 54 may remain in order to support sealing of the ends 68, 70 as described herein. Smooth, fired, quartz formed in a lip 30 provides distinct advantages.

A distance 74 from each end 68, 70, a lug 64 or band 64 may serve as a base for connections 65 to power inputs. A distance 75 from each end 68, 70, an end coating 62 of conductive material may feed electricity into the resistive coating 60.

Electricity travels between the bands 64 and end coatings 62 along a resistance length 76. Power dissipation for heating requires current and a resistance. The coating 60 is both resistive and conductive along the length 76 in order to carry sufficient current to provide the electrical power (wattage) required. Accordingly, the coating 60 is sized in thickness and length to provide the proper combination of conductivity and resistance along the length 76.

The coating 60 is designed and applied within parameters engineered to balance several factors. For example, if the textured surface 58 is too rough, the conduit 12 may fail under test pressures and burst. If not sufficiently rough, the textured surface 58 may provide inadequate adhesion forces between the resistive coating 60 and the outer surface 54 of the conduit 12.

Likewise, the resistive coating 60 requires uniformity and conductive, cross-sectional area along the length 76 in an axial direction 50*a*. However, too much of the coating 60, may provide so much strength within the coating 60, that the resistive material 60 separates mechanically from the textured surface 58, due to a superior bond to itself during thermal expansion at elevated temperatures.

Ceramics and many materials, such as quartz, provide comparatively little or no expansion with increased temperature. By contrast, most metals provide substantial expansion with increased temperature. Accordingly, at elevated temperatures, the coating 60 tends to expand and separate as a continuous annulus surrounding the conduit 12.

At a microscopic level, the coating 60 tends to shear away from the microscopic inclusions developed in the textured surface 58. Thus, a balance in application of the coating 60 is required to balance the forces due to the coefficient of thermal expansion with the mechanical bond between the coating 60 and the inclusions in the textured surface 58.

The effective resistance of the coating 60 changes as the coating 60 is heat treated. Heat treatment does not melt the deposited coating 60. Nevertheless, metallurgical grain boundaries form, grow, and affect electrical conductivity in the coating 60. If the effective resistance is too high, yet in the range of the design point, the heater 10 does not provide sufficient energy input through the wall 52 into a fluid flow 78. If the resistance is too low, but close to the design point, the heater 10 provides too much output, and may be outside the desired range of control. In some apparatus, too high a heating rate can damage equipment, including fracturing solids due to differential expansion.

The end coating 62 or band 62 if applied too thickly may overcome the adhesion or other bonding between the end coating 62 and the resistive coating 60. Alternatively, the end coating 62 may maintain a sufficient bond with the coating 60, but separate the coating 60 from the textured surface 58 if either 60, 62, or their combination is too thick and mechanically rigid. Similarly, as with the resistive coating 60, applying the end coating 62 too thinly, tends to reduce the average number of atoms at any site, yielding poor uniformity, and inadequate process control for reliable currant conduction.

Too high a resistance in the end coating 62 may generate too much heat. Excessive heat may destroy the connection between the end coating 62 and the base resistive coating 60, or separate both from the textured surface 58. The types of difficulty that may arise with excessive heat generation may result from too high a resistance in the end coating 62.

A lug 64 or connector band 64 needs to be secured with the same considerations required for the coatings 60, 62, too much material may provide too high strength. Too little material may raise local heating issues as a result of inadequate conductivity. Materials may be selected to provide flexibility or malleability.

Figure 4:
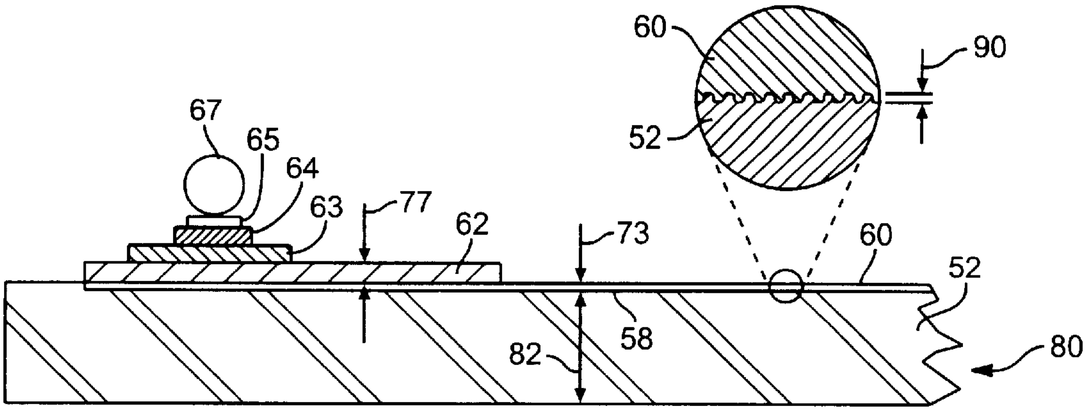
FIG. 4 is a schematic, side, elevation, cross-section view of a portion of the apparatus of FIG. 3, illustrating the comparative positions of the substrate, resistive coating, end plating (coating), and connection scheme for introducing electricity to the apparatus.

Referring to FIG. 4, a wall 52 may be thought of as a substrate 80. Thus, a substrate 80 may generalize a conduit 12 into any particular shape, open, closed, and so forth. As discussed, a thickness 82 of a substrate 80 provides mechanical integrity in a conduit 12. That is, a thickness 82 of a wall 52 provides mechanical strength. However, the conduits 12 must typically sustain some pressure load. Accordingly, excessive thickness 82 may actually cause a stress distribution between the inner surface 56 and the outer surface 54. Another concern with the thickness 82 is the effect of the inclusions in the textured surface 58. The thickness 82 may benefit from being sufficiently large that the inclusions of the textured surface 58 lack sufficient influence to propagate cracks therethrough.

The thickness 73 of the resistive coating 60 is precisely controlled. The thickness 73 may be on the order of numbers of atoms in dimension up to some few millionths of an inch. At a microscopic level, the thickness 73 maybe of an order of magnitude the same as that of the size of inclusions in the textured surface 58, or less. Accordingly, the coating 60 may appear like a crepe material. This crepe may be a thin, crinkly film following the peaks and valleys of the textured surface 58.

Thermal expansion with a rise in temperature maybe easily accommodated by localized bending of portions of the coating 60. However, if the thickness 73 becomes too great, the coating 60 behaves as a beam extending in the circumferential direction 50*c* and the axial direction 50*a*. Accordingly, the beam may change diameter, applying comparatively large radial forces withdrawing the small irregularities from their places filling the inclusions in the textured surface 58.

Excellent thermal contact between the coating 60 and the conduit 12 requires superior adhesion by balancing the thickness 73. The value of the thickness 73 may be successfully selected to provide mechanical compliance with the textured surface 58 while providing uniformity. Thus, material selection and selection of the thickness 73 along with selection of the size of the conduit 12 can be used to control the heat input at a desired level for a fluid flow 78 while maintaining mechanical integrity and thermal conductivity.

The thickness 77 of the end coating 62 is selected according to similar parameters, as discussed above. Although a solder 78 may be selected from a softer material than the coating 60, as may the end coating 62, mechanical mass eventually provides compressive strength. Accordingly, expansion of the band 64 or end coating 62 with an increase in temperature may cause the separation of metals from the inclusions by which capture is maintained Selecting materials that are comparatively malleable and thin, while having comparatively higher electrical conductivity than the coating 60, can produce suitable mechanical and electrical integrity.

The roughness height 90 is detectable by its effect on light. Visual inspection serves very well, since the roughness height 90 dramatically affects the sheen of the outer surface 54, even with comparatively slight roughness heights 90. Thus, the adequacy of the roughness height 90 may be reasonably well detected from a visual inspection.

Excessive roughness height 90 may result from removing too much of the wall 52 from the textured surface 58. A grit size (e.g., bead size), and a time for application of uniform grit blasting may provide a suitable roughness height 90. The roughness height 90 should accommodate mechanical lodgment of metal atoms within inclusions in the surface. Thus, micro-mechanical anchors grip the thin coating 60 against the outer surface 54.

The roughness height 90 is significant, not for its size alone, which need only accommodate a few atoms of metal, but in the crystalline sharpness and angularity of the inclusions. Because the spalling of material from the outer surface under the influence of grit, bead, or sand blasting will tend to break along crystal boundaries, a fully randomized set of inclusions, including concavities overhung by sharp crystalline corners, may securely capture pockets of metallic atoms of the coating 60.

Likewise, the resistive path of the coating 60 may be affected by the roughness height 90 compared to the thickness 73. For example, a smooth outer surface 54 tends to provide a rather direct path. A textured surface 58, provides a circuitous path over hills and valleys. Thus, providing too great a thickness 73 may also decrease resistivity reducing the heating wattage below a designed value.

Figure 5:
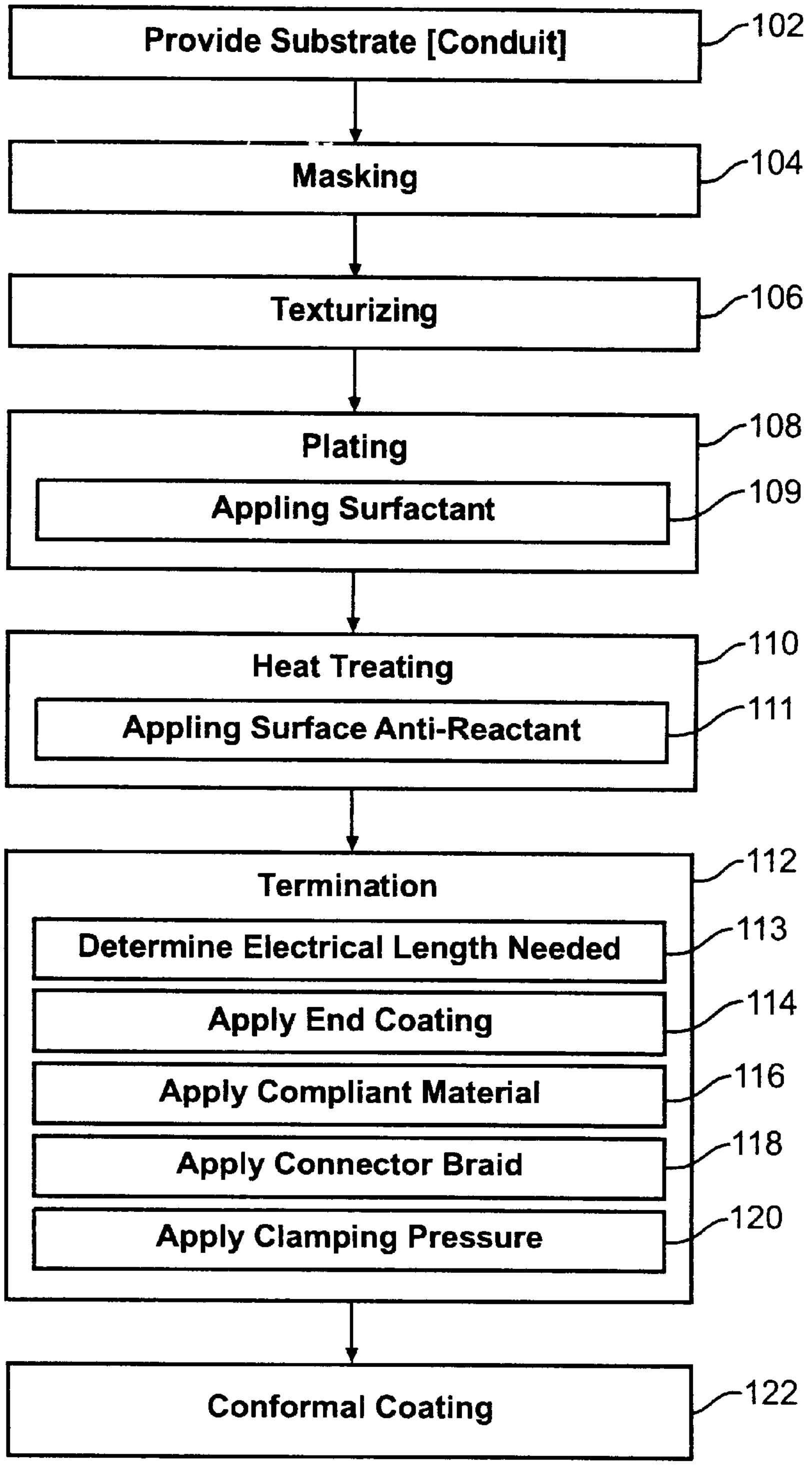
FIG. 5 is a block diagram of one embodiment of a process for making a heating unit in accordance with the invention.

Referring to FIG. 5, one embodiment of a method for manufacturing the heaters 10 may include providing 102 the conduit 12 or other substrate 80, followed by suitable masking 104 and texturizing 106. Texturizing 106 may include bead blasting, sand blasting, grit blasting, or etching by other means. The texturizing 106 is important for providing mechanical grip, as discussed above. Nevertheless, texturizing 106 should not compromise the mechanical integrity of the conduit 12 under operational pressures. Thus the roughness height 90 is balanced in that it does not create inclusions that will compromise the mechanical integrity of the conduit 12.

Likewise, the wall thickness 82 is selected to balance heat transfer demands for energy transfer per unit area, against surface temperatures and thermal gradients. Thermal gradients are considered in view of the thickness 82 and thermal stresses created.

A thin film 60 is applied in a plating process 108. In one embodiment, electroless nickel plating has been found effective. The plating process is continued for a time selected to provide a thickness 73 that balances current-carrying capacity of the film, mechanical stiffness and strength limits required to maintain adhesion, and coating uniformity (related to both other factors).

By balance is meant adequacy and uniformity of performance, either mechanically, thermally, electrically, or a combination thereof. If the coating 60 on a conduit 12 or other substrate 80 is adequate, it may be heat treated 110.

In one embodiment, the heat-treating process 110 involves a metallurgical heat treatment 110. Such a process 110 does not elevate temperatures sufficiently to melt the metallic coating 60. Rather, temperatures are sufficiently high during the process 110 to raise the energy level of various atoms within the composition of the coating 60, encouraging migration of interstitial materials. Migration of interstitial materials fosters growth of various grain boundaries. Growth of grain boundaries affects the binding of electrons into orbitals of various atomic or molecular structures. Thus, the heat-treating process 110 may substantially affect electrical conductivity. Accordingly, the time and temperature of the heat treatment process 110 provide a certain element of control over the effective electrical resistivity of the coating 60.

Heat treating 110 may include a surface treatment. In one embodiment, application 111 or deposition 111 (e.g., vapor deposition) of a surface-protecting layer may include adding a composition (e.g., a silicate, in one embodiment) to the heat-treatment environment (e.g., oven). The application process 111 may include masking portions of the coating 60 that will later be coated with additional conductive materials. The protective process 111 provides a non-reactive coating or passivating coating to reduce oxidation of the resistive coating 60 during heat treating 110.

Following the heat-treating process 110, and if resistance is satisfactory in the coating 60, a termination process 112 provides end coatings 62, and so forth. The termination process 112 may include, among other steps, application 114 of a termination coating 62 or end coating 62 to reduce the resistance that would be available in the coating 60. Resistance is typically lowered by half an order of magnitude. The thickness 77 of the end coating 62 must be balanced to provide good current distribution, while not compromising the mechanical integrity of the bond between the conductive-resistive materials and the conduit 12 or substrate 80.

The termination process 112 may involve application 114 of a end coating 62 having a specific length 75 calculated to provide a precise power delivery in the heater 10. Similarly, a soft, compliant, conductive material 63 may be added 116 over a portion of the end coating for receiving a connector 64. The connector 64 may be a suitable braided conductor 64, applied 118, and then mechanically clamped 120 by a clamping mechanism 67.

Chemical bonds have been found unsatisfactory in many instances, as they add mechanical thickness and stiffness of materials. Thus, the compliant material 63, yielding under the load of a braided conductor 64, at the urging of a clamping mechanism 67, provides sufficient compliance that strength and stiffness of the film 60 are not significantly affected. Therefore, mechanical bonding of the coating 60 to the conduit 12 (e.g., substrate 80) is not compromised. A protective, conformal coating 66 may be applied 122 following, or as part of, the termination process 112.

The plating process 108 may be one of several types, including vapor deposition, sputtering, painting, sintering, powder coating, and electroless plating. In electroless plating, such as electroless nickel plating, application 109 of a surfactant may greatly improve the quality of the coating 60. Application 109 of a surfactant may actually involve a surfactant scrub 109 in which vigorous application of force breaks down any pockets of gas that might adhere to concavities in the textured surface 58. Thereafter, the coating 60 may form, maintaining a continuous mechanical structure about the inclusions of the textured surface 58.

As a texturing method, bead blasting has provided considerable uniformity in the fracture mechanics of forming inclusions. Also, pressure tests show that mechanical integrity may be maintained thereby.

Figure 6:
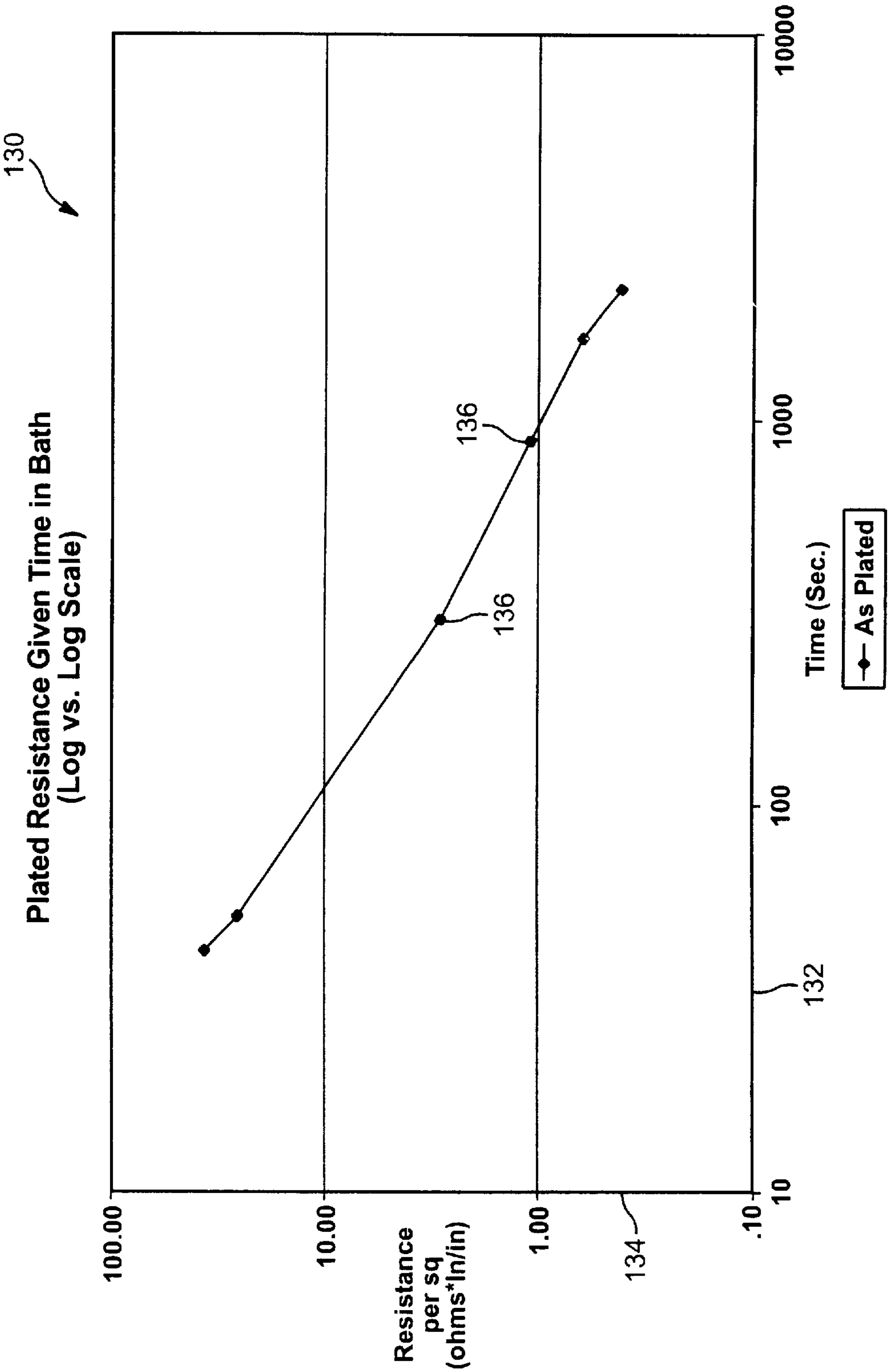
FIG. 6 is a graph illustrating a relationship between a bath time in a plating composition, illustrating the effect of normalized resistance per square in ohm-inches per inch.

Referring to FIG. 6, a graph 130 having a time axis 132 and resistance axis 134 illustrates various data points 136 from tests. The values 136 characterize the effect of time, during plating, on the initial resistance 134 of the coating 60.

The scales are logarithmic. Thus, the process results in resistance being dependent upon a power of time. However, the relationship does not appear to change dramatically at any point on the graph 130.

Figure 7:
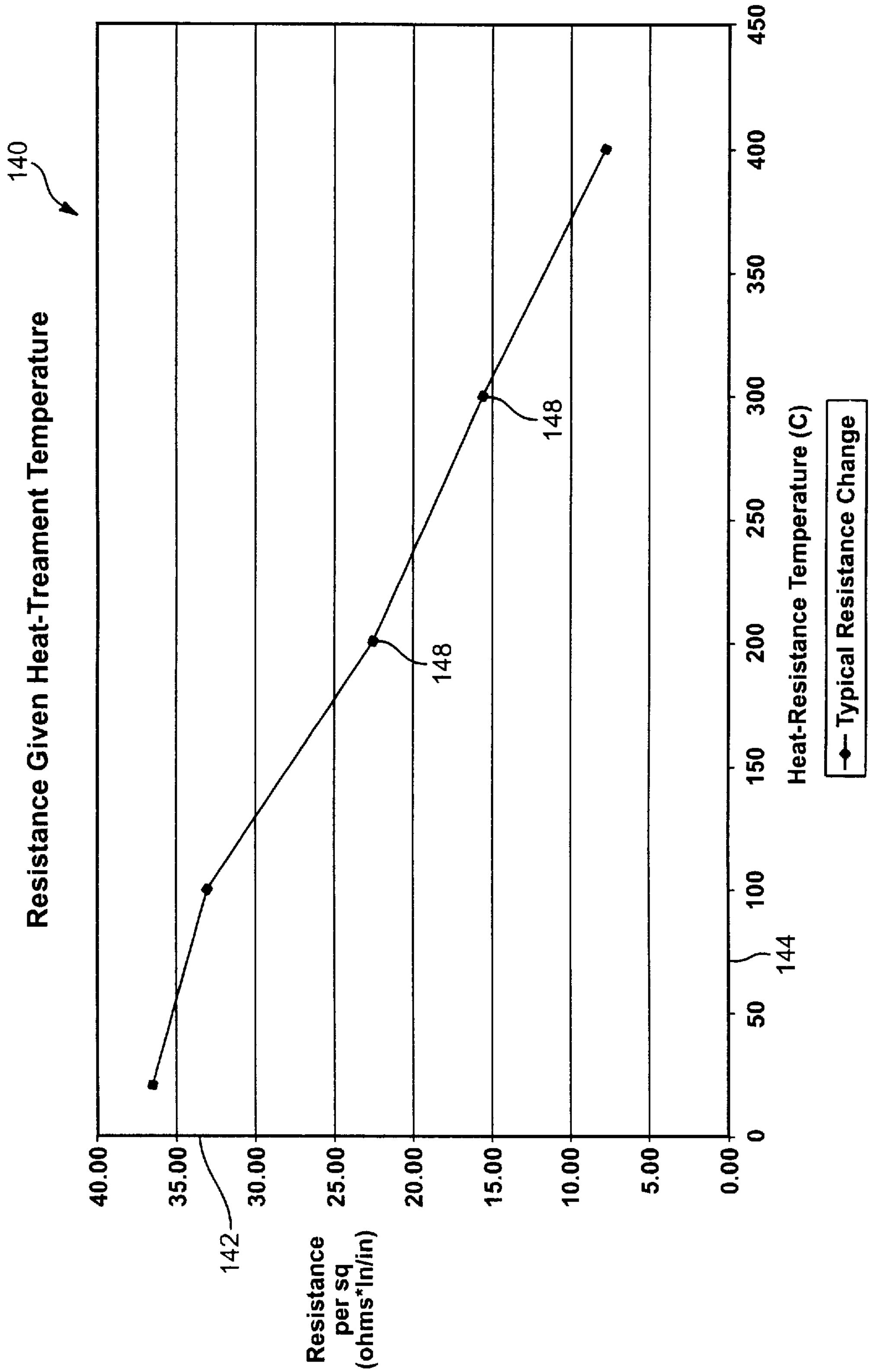
FIG. 7 is a graph illustrating a comparison between terminated resistance and watt density in a heater in accordance with the invention as a function of the cured resistance of a coating in accordance with the invention, further illustrating typical termination resistance adjustment depending upon the cured resistance of a conductive and resistive coating.

Referring to FIG. 7, a chart 140 of a resistance in a range 204 corresponds to a value of heat-treat temperature in a domain 144 of temperatures for the coating 60. The values 148 reflect the adjustment of resistance in ohm-inches per inch, due to a particular temperature during heat treating of the coating 60. The resistance of the coating 60 may vary due to variations in controlled parameters, such as the time and temperature associated with heat treatment. Parametric controls may vary during the plating process, and the heat-treating process 110. Thus, FIG. 7 reflects an ability to adjust the effective resistance of the apparatus 10 according to the heat-treat temperature.

Figure 8:
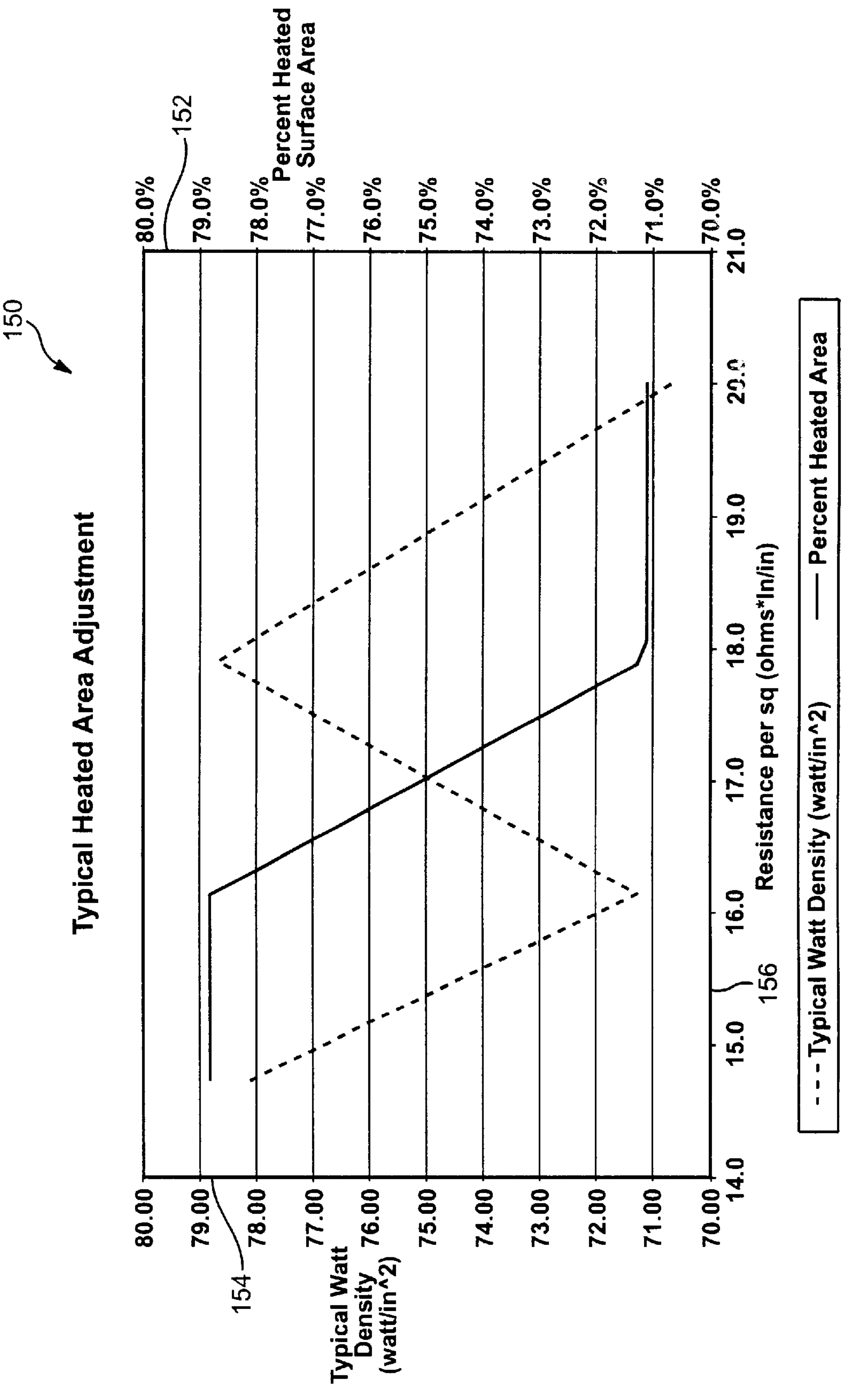
FIG. 8 is a chart illustrating a change in heating area (function of termination distance), in order to correct for variations in cured (heat treated) resistance values in a resistive coating of an apparatus in accordance with the invention.

Referring to FIG. 8, a graph 150 shows both a percentage 152 of available surface area heated by the coating 60 and a watt density 154 as a function of resistance per square 156. The graph 150 shows the correction ability for any given resistivity resulting from the heat-treat process 110. That is, given a particular value of the cured resistance 156, a final percentage 152 of area to be heated (powered) may be determined. Thus, the exact locations of the end coatings may be designed to obtain the desired heated area. Similarly, for a particular cured resistance 156, a watt density 154 may be determined. These results are typical of the influence that the end termination process 112 can have on correcting the overall value of resistance of the coating 60 in an apparatus 10.

From the above discussion, it will be appreciated that the present invention provides apparatus and methods for heating ultra pure fluids in a hyper-clean environment. Power densities are very high, while heater reliability is superior. Meanwhile, manufacturing adjustments are available to produce high yields of highly predictable product.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed and desired to be secured by U.S. Letters Patent is:

1. A method for adhering an electrically resistive coating to a substrate for implementing an electrical device, the method comprising:

selecting a substrate having a wall having an outer surface;

modifying, exclusively by mechanical erosion, the outer surface to provide a textured region having sharp edged inclusions to mechanically secure a coating thereto; and applying a coating comprising a conductor configured to be electrically resistive, to extend over at least a portion of the textured region, and to adhere to the outer surface by micro-mechanical bonding with the sharp edged inclusions under stresses due to a differential in respective coefficients of thermal expansion thereof.

2. The method of claim 1, wherein modifying further comprises selecting a mechanical erosion process from the group consisting of abrasive media blasting, bead blasting, abrasive grinding, and hard tool cutting.

3. The method of claim 2, further comprising selecting a dielectric material for the substrate.

4. The method of claim 3, wherein the wall is selected to have a thickness, a thermal conductivity, and a strength, and wherein the thickness is selected to balance heat transfer due to the thermal conductivity against durability due to the strength.

5. The method of claim 4, wherein selecting the wall thickness further comprises balancing thermal stresses associated with heating of the substrate by the coating and cooling of the substrate by a fluid in contact with the opposing side of the substrate.

6. The method of claim 5, wherein the textured region is characterized by a roughness height, selected to balance mechanical integrity of the substrate and adhesion of the coating.

7. The method of claim 6, further comprising selecting a thickness not exceeding the coating of the order of magnitude of the roughness height.

8. The method of claim 7, further comprising selecting a material for the coating from metallic materials.

9. The method of claim 8, wherein the coating material is a composition containing nickel.

10. The method of claim 8, further comprising forming the coating in a crepe pattern configured to provide bending of the coating sufficient to substantially limit the ability of the coating to resist bending in response to thermal stresses.

11. The method of claim 10, further comprising selecting a thickness for the coating to balance mechanical forces of the coating on the substrate against effective stresses due to differences between the coefficients of thermal expansion of the coating and the substrate over an operational temperature range.

12. The method of claim 11, wherein the coating is characterized by a thickness selected to balance adhesion thereof, with respect to the textured surface, against uniformity of electrical resistivity thereof.

13. The method of claim 12, wherein the roughness height is further selected to balance a value of heat transfer through the wall, coating uniformity, mechanical integrity of the conduit, and adhesion of the coating, all at operational levels.

14. The method of claim 13, wherein the metallic material is deposited at a thickness characteristic of a process selected from spraying, sintering, flame spraying, vapor deposition, sputtering, and electroless coating.

15. The method of claim 14, further comprising providing an oxidation inhibitor in a heat-treating atmosphere covering a section proximate the coating.

16. The method of claim 15, further comprising applying an end-plating, conductive layer to control an effective resistive length of the coating.

17. The method of claim 16, wherein the substrate is configured as a conduit to conduct a fluid.

18. The method of claim 17, wherein the substrate comprises a crystalline material.

19. The method of claim 18, wherein the crystalline material is fused quartz.

20. The method of claim 1, wherein selecting the substrate further comprises selecting a non-reactive material for conducting a fluid with less than parts-per-million contamination thereof.

21. The method of claim 1, further comprising selecting a roughness height to balance a value of heat transfer through the wall, uniformity of coating, mechanical integrity of the substrate, and adhesion of the coating.

22. The method of claim 1, wherein the coating is formed of a substantially metallic material plated at a thickness selected to balance electrical resistivity and mechanical adhesion to the textured region.

23. The method of claim 1, wherein the coating is a composition containing nickel.

24. The method of claim 1, wherein the coating has a coefficient of thermal expansion greater than that of the substrate.

25. The method of claim 1, wherein the substrate comprises a substantially closed cylindrical cross-section.

26. The method of claim 1, further comprising selecting a thickness of the coating of the order of magnitude of the depth of the inclusions.

27. The method of claim 1, further comprising forming the coating in a crepe pattern configured to provide bending of the coating sufficient to substantially limit the ability of the coating to resist bending in response to thermal stress.

28. The method of claim 1, further comprising selecting a thickness for the coating to balance mechanical forces of the coating on the substrate against effective stresses due to differences coefficients of thermal expansion of the coating and the substrate over an operational temperature range.

29. The method of claim 1, wherein the coating is characterized by a thickness selected to balance adhesion thereof, with respect to the textured region, against uniformity of electrical resistivity thereof.

30. A method for adhering an electrically resistive coating, the method comprising:

selecting a conduit having a wall having an outer surface;

modifying a portion of the outer surface exclusively by mechanical abrasion to provide a textured region having inclusions with sharp edges; and applying a coating comprising a conductor configured to be electrically resistive, to extend over at least a portion of the textured region, and to adhere to the textured region by micro-mechanical gripping of the inclusions under stresses due to a differential in respective coefficients of thermal expansion thereof.

31. The method of claim 30, wherein the conduit is formed of quartz.

32. The method of claims 31, wherein applying a coating further comprises applying a coating over the sharp edges of the inclusions to promote localized bending thereof to relieve circumferential stress.

33. A method for adhering an electrically resistive coating, the method comprising:

selecting a conduit having a wall forming an enclosed, fluid flow path, the wall having an exterior surface;

generating a textured surface by mechanically abrading a portion of the exterior surface to form crystalline, angular peaks and valleys;

selecting an electroless coating comprising an electrically resistive conductor;

applying the electroless coating to the crystalline, angular peaks and valleys of at least a portion of the textured surface to adhere thereto by micro-mechanical gripping to promote localized bending thereof to relieve stress during expansion due to increases in temperature.

34. The method of claim 33, wherein the conduit is formed of quartz.

* * * * *